United States Patent [19]

Puar

[11] Patent Number: 5,287,241
[45] Date of Patent: Feb. 15, 1994

[54] SHUNT CIRCUIT FOR ELECTROSTATIC DISCHARGE PROTECTION

[75] Inventor: Deepraj S. Puar, Sunnyvale, Calif.
[73] Assignee: Cirrus Logic, Inc., Fremont, Calif.
[21] Appl. No.: 830,715
[22] Filed: Feb. 4, 1992
[51] Int. Cl.$^5$ .............................................. H02H 9/04
[52] U.S. Cl. .................................... 361/56; 361/111; 361/91; 257/357
[58] Field of Search ................... 361/56, 58, 91, 111; 227/356, 355, 357

[56] References Cited

U.S. PATENT DOCUMENTS

| | | |
|---|---|---|
| 4,595,941 | 6/1986 | Avery ................................. 361/91 |
| 5,189,588 | 2/1993 | Yano et al. ............................ 361/56 |

Primary Examiner—Todd DeBoer
Attorney, Agent, or Firm—Blakely, Sokoloff, Taylor & Zafman

[57] ABSTRACT

A circuit is added to a complementary metal-oxide silicon (CMOS) integrated circuit (IC) to provide an intentional, non-reverse-biased VDD-to-VSS shunt path for transient currents such as electrostatic discharges (ESD). This circuit protects the IC from ESD damage by turning on before any other path, thus directing the ESD transient current away from easily damaged structures. Specifically, the ESD transient current is steered from the VDD rail to the VSS rail through the on conduction of a P-channel transistor whose source and drain are connected to VDD and VSS respectively. The voltage on the gate of this transistor follows the VDD supply rail because it is driven by a delay network formed by a second transistor and a capacitor. This VDD-tracking delay network turns the VDD-to-VSS transistor on during a transient and off during normal operation of the IC.

17 Claims, 6 Drawing Sheets

SHUNT CIRCUIT FOR ELECTROSTATIC DISCHARGE PROTECTION

FIELD OF THE INVENTION

This invention relates generally to the design and layout of integrated circuits (ICs) in technologies such as complementary metal-oxide silicon (CMOS as defined more broadly herein). Specifically, the invention relates to protection of CMOS ICs from transients such as electrostatic discharges (ESD) that may be applied to the terminals of the IC. This is accomplished through the use of a circuit that provides an intentional, forward-biased shunt path between the VDD and VSS power supply rails upon the appearance of a transient on the terminals of the IC to discharge the transient without subjecting the IC circuit to excessive or fatal voltage and current spikes.

BACKGROUND OF THE INVENTION

Unless potentially elaborate precautions are taken, electrostatic charges build up whenever non-conducting objects rub. Usually electrostatic charges dissipate harmlessly, but if they happen to discharge through an IC they can render the IC permanently non-functional. If an IC such as a CMOS IC is too sensitive to electrostatic discharge, then routine handling of the IC, or of circuit boards containing it, can destroy it.

One of the common methods used to evaluate the electrostatic discharge protection of an IC is the human body model, which is defined in MIL-STD 883C METHOD 3015.6. This evaluation method requires the discharge of a 100 pF capacitor, typically charged to 2000 volts, through a 1500 ohm resistor into one terminal of an IC under test, while grounding some other terminal of the IC. The higher the voltage that can be discharged through the IC without causing its functional failure, then the better its ESD protection. Other methods used for evaluating ESD protection are the machine model and the charged device model.

Various structures have been fabricated as part of CMOS and CMOS-like ICs to protect them from the destructive effects of ESD. FIG. 1 shows a circuit diagram that is typical of prior-art protection circuits. ICs typically have numerous input and output terminals, as well as some terminals that are combination input/output (I/O) terminals. FIG. 1 shows a generic ESD protection circuit for one input terminal and one output terminal of a CMOS IC built using a P-type substrate, which is connected to VSS and in which the N-channel transistors are fabricated. N-type wells, connected to VDD, are fabricated in substrate and the P-channel transistors are fabricated within these N-type wells. Input terminal T1 is protected by diodes D1 and D2, which are large-area diodes between T1 and power supply rails 101 and 102 for VSS and VDD respectively.

FIG. 1 also shows a typical prior-art output protection circuit. This circuit can be considered to include the parasitic diodes D3 and D4 which exist between output terminal T2 and power supply rails 101 and 102 respectively, and which are formed parasitically at the junctions of the drain diffusions of transistors N2 and P2 respectively. Transistors N2 and P2 form the output driver for output terminal T2. Also, FIG. 1 shows the parasitic well-to-substrate diode D5 between the VDD and VSS supply rails 102 and 101, which is formed at the edges of the N-well diffusions, which surround all P-channel transistors on the IC. FIG. 5 is a cross-sectional view of transistors N2 and P2, for the case of an P-substrate CMOS process. FIG. 5 shows where parasitic diodes D3 and D4 are formed, and the contribution of the N-type well surrounding P2 to forming parasitic diode D5. In contrast to parasitic diodes D3, D4, and D5, diodes D1 and D2 are intentionally included in the IC layout for ESD protection.

The level of ESD protection of an IC is measured by applying ESD transients between any two terminals of the IC. For example, if in FIG. 1 a positive pulse is applied to output terminal T2 with respect to input terminal T1 then, because there is no direct current path between these two terminals, the ESD energy will find the path of least resistance. This could be the path from output terminal T2 through resistor R2, then through N-channel transistor N2 via breakdown from drain to source or via breakdown from drain to substrate, then from the substrate to the VSS rail 101, and then through diode D1 to the input terminal T1. Alternatively, the path of least resistance could be through diode D4 to the VDD rail 102, then via breakdown of diode D5, then through the VSS rail, and then through diode D1 to input terminal T1. In each of these paths, an avalanche-type breakdown of a reverse-biased P-N junction is involved.

In avalanche breakdown of a P-N junction under reverse-biased voltage conditions, free carriers passing through the P-N junction gain enough energy from the electric field that is created by the voltage difference across the P-N junction that when they collide with covalent bonds in the lattice of the crystalline silicon they break the bonds. Breaking covalent bonds frees additional carriers, which likewise gain energy from the electric field, collide with covalent bonds, and free more carriers. This is much like an avalanche in which a small amount of snow high on a mountain starts moving and results in larger amounts of snow moving as the avalanche comes down the mountain. Just as a snow avalanche leaves most of the mountain's snow cover intact, avalanche P-N junction breakdown is typically localized to a small region with the largest electric field. This localization effect typically means that the current density, or current per unit area, occurring during avalanche breakdown is very high, which can lead to localized heating, which can melt portions of the crystalline silicon lattice or allow dopant atoms to migrate within the crystal, which can create a permanent functional failure of the IC. This localization effect typically means that the amount of current that can flow through a P-N junction under breakdown without permanent damage is orders of magnitude smaller than the amount of current that the same P-N junction can carry without damage when it is forward-biased.

In the prior art, the level of ESD protection is typically limited to the amount of energy that the weakest breakdown mechanism on the IC can handle without damage. In a typical commercial CMOS IC, the path mentioned first in the above discussion of FIG. 1 usually has a lower breakdown voltage, and thus offers the path of least resistance. Whenever an ESD transient traveling this path has too much energy, a destructive failure occurs, typically around the drain-to-gate area of transistor N2, due to localized heating during avalanche breakdown. Much of the prior art focuses on either improving the layout of transistor N2 together with resistor R2, or on improving transistor N2's drain junction doping profile to allow for larger ESD transients to be accommodated non-destructively during avalanche breakdown and snapback.

Other prior art has used a parasitic SCR structure (shown in FIG. 2) between the VDD and VSS rails, in which the breakdown voltage of the parasitic SCR is low. This technique attempts to provide a path of less resistance than the path through the drain of transistor N2. A good summary of this technique is provided in a paper by L. R. Avery, "A review of electrostatic discharge mechanisms and on-chip protection techniques to ensure device reliability", Journal of Electrostatics, 24 (1990), pp. 111–130.

Other prior art by Guggenmos and Holzner, "A New ESD Protection Concept for VLSI CMOS Circuits Avoiding Circuit Stress", 1991 EOS/ESD Symposium Proceedings, pp. 74–81 shows the use of an N-channel transistor N3 (shown in FIG. 3), whose drain is connected to VDD rail 102 and whose gate and source are connected to VSS rail 101 Transistor N3 operates in the drain avalanche breakdown and snapback mode, thus providing a current path from VDD to VSS.

Other prior art by Puar, "Input Protection Device for Integrated Circuits", U.S. Pat. No. 4,786,956, shows the use of an N-channel transistor whose drain is connected to the input terminal, whose source is connected to VSS and whose gate is connected to the substrate through a resistor (see column 3, lines 38–54. Like the present invention, the circuit path is provided that is intended to carry the ESD discharge without breakdown. It differs from the present invention, however, in that it requires one protection circuit per input pin, that it uses an N-channel transistor as the switching component that makes or breaks the path, and that the switching transistor is turned on via capacitive coupling from the ESD voltage on the drain of the N-channel transistor to its gate. In contrast, the present invention requires one protection circuit per each pair of VDD and VSS power supply rails, uses a P-channel transistor as the switching component, and turns on the switching component by direct coupling of the ESD pulse.

Other prior art by Keller is discussed in Puar's '956 patent column 1, line 65 to column 3, line 23. This prior art is suitable to protect input terminals only because of the high series resistance associated with resistor RA of FIG. 2 of Puar '956. Also, this prior art depends on breakdown mechanisms both in diode JA and transistor QA of the same Figure.

All the above-mentioned prior art techniques, other than Puar '956, have the limitation that they mechanisms on parasitic paths to conduct the ESD transient current. One limit to ESD protection that is inherent in depending on junction breakdown mechanisms is that, because of the localization effect of avalanche breakdown and its associated high current density and heat, typically the amount of current that can flow through a P-N junction under breakdown without permanent damage is orders of magnitude smaller than the amount of current that the same P-N junction can carry without damage when it is forward-biased. Another limit to ESD protection that is inherent in depending on junction breakdown mechanisms is that the breakdown voltage of the different devices is a function of the underlying processing technology used to fabricate the IC. What may be the path of least resistance on an IC fabricated using one technology may be different than the path of least resistance on an IC fabricated on another technology, even for similar or identical IC layouts, which complicates the task of engineering an effective ESD protection circuit. Thus there is a need for an ESD protection mechanism that avoids P-N junction breakdown.

BRIEF SUMMARY OF THE INVENTION

A circuit is added to a complementary metal-oxide silicon (CMOS) integrated circuit (IC) to provide an intentional, non-reverse-biased VDD-to-VSS shunt path for transient currents such as electrostatic discharges (ESD). This circuit protects the IC from ESD damage by turning on before any other path, thus directing the ESD transient current away from easily damaged structures. Specifically, the ESD transient current is steered from the VDD rail to the VSS rail through the on conduction of a P-channel transistor whose source and drain are connected to VDD and VSS respectively. The voltage on the gate of this transistor follows the VDD supply rail because it is driven by a delay network formed by a second transistor and a capacitor. This VDD-tracking delay network turns the VDD-to-VSS transistor on during a transient and off during normal operation of the IC.

It is an object of this present invention to provide improved transient protection for ICs implemented using CMOS and CMOS-like technologies such as BIC-MOS, whether fabricated using metal gates or silicon gates, or using insulating substrates such as silicon on sapphire.

It is a further object of the present invention to provide transient protection using a circuit that is effective across variations in the IC fabrication process.

A still further object is to not interfere with normal circuit operation.

It is a still further object to provide an intentional transient carrying path that does not include any P-N junctions operating under breakdown.

It is a further object to have a VDD-tracking delay network that turns on and off a path from VDD-to-VSS.

A still further object is to minimize the silicon area required to fabricate an IC by not adding ESD protection circuitry at each input and output pin.

DETAILED DESCRIPTION OF THE PREFERRED EMBODIMENT

The present invention adds a circuit to an IC to complete an intentional VDD to VSS current path that turns on to carry transients such as ESD before any parasitic path in the IC turns on. This structure directs the transient current away from easily damaged structures. Specifically, the ESD transient current is steered from the VDD rail to the VSS rail through the on conduction of a P-channel transistor.

Figure 1:
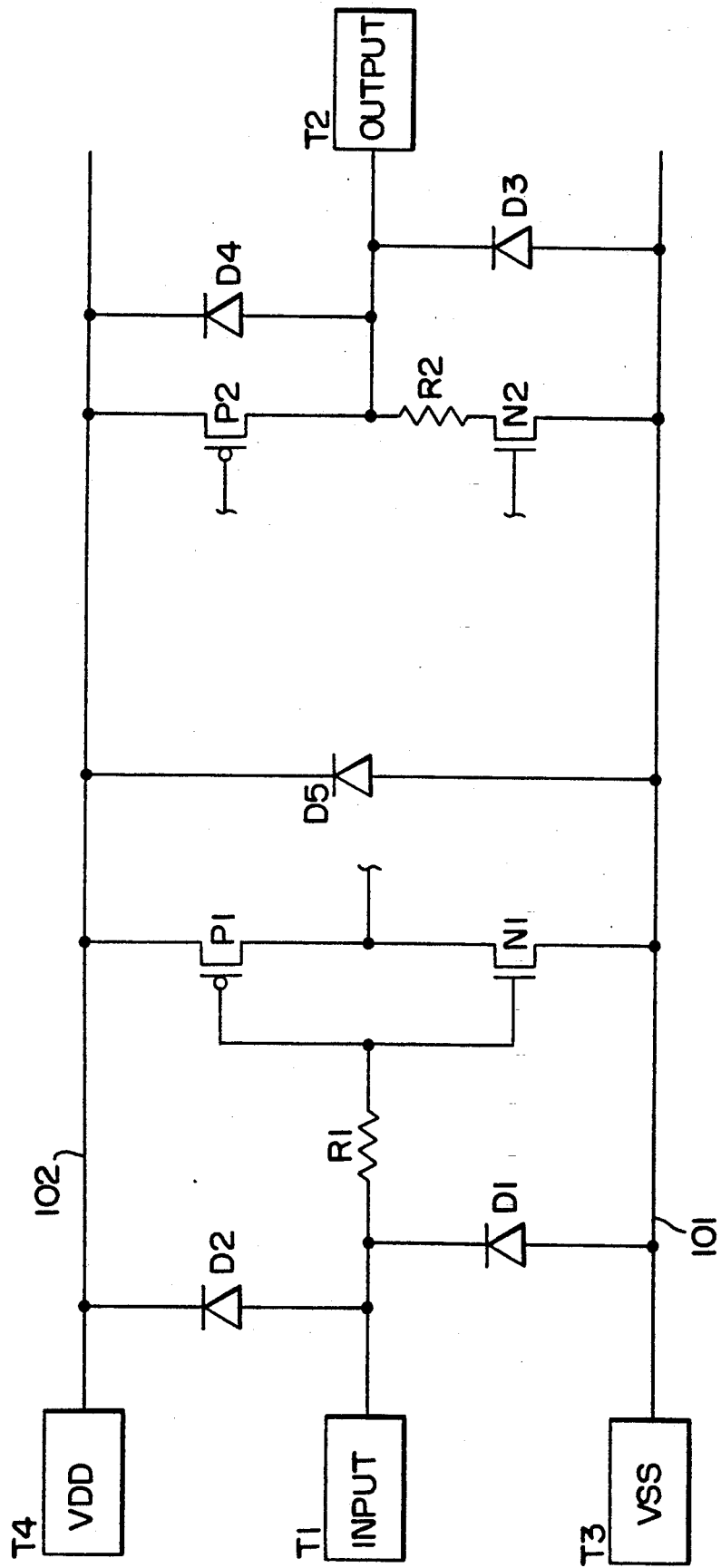
FIG. 1 is a circuit diagram of prior-art generic CMOS input and output protection circuits.
Figure 2:
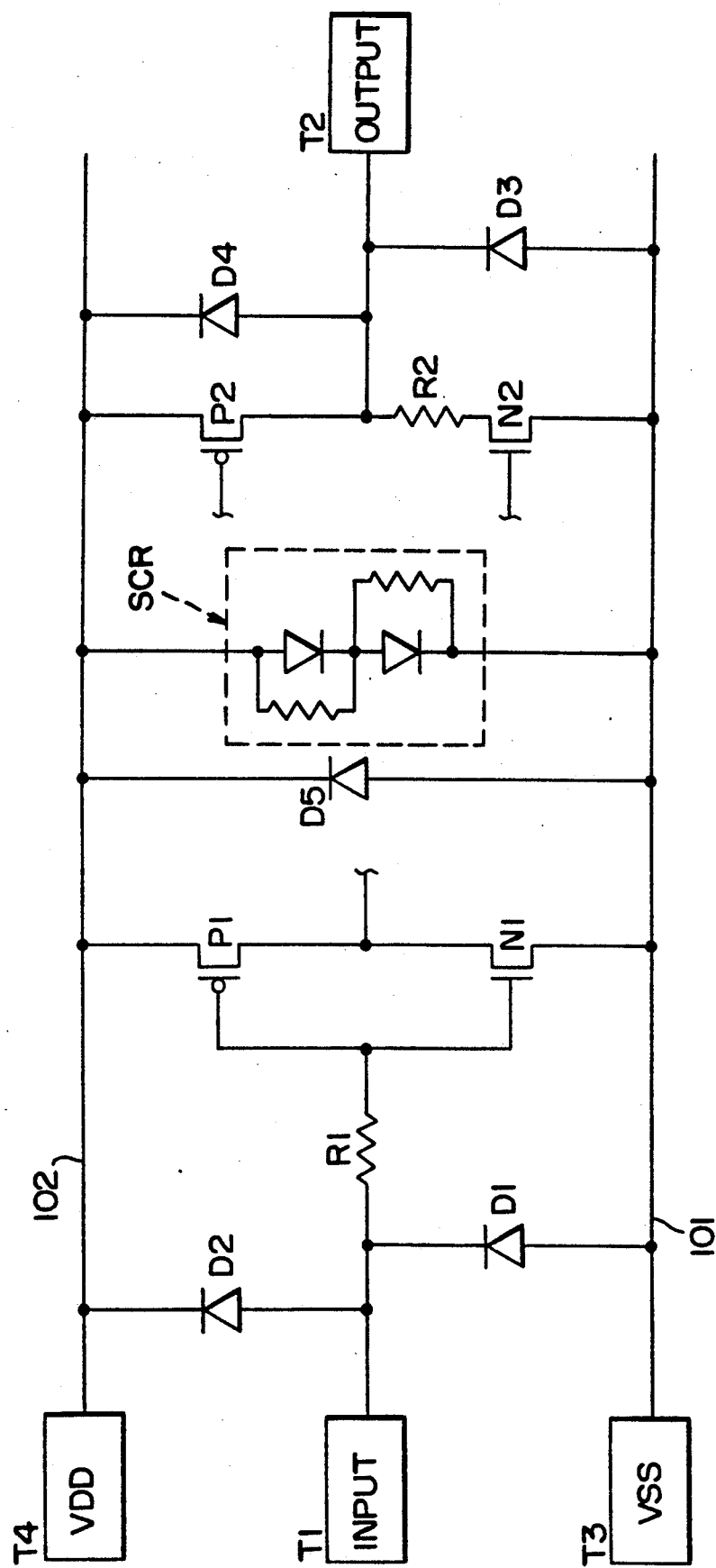
FIG. 2 is a Circuit diagram of prior-art generic CMOS input and output protection circuits with the addition of a parasitic SCR between VDD and VSS.
Figure 3:
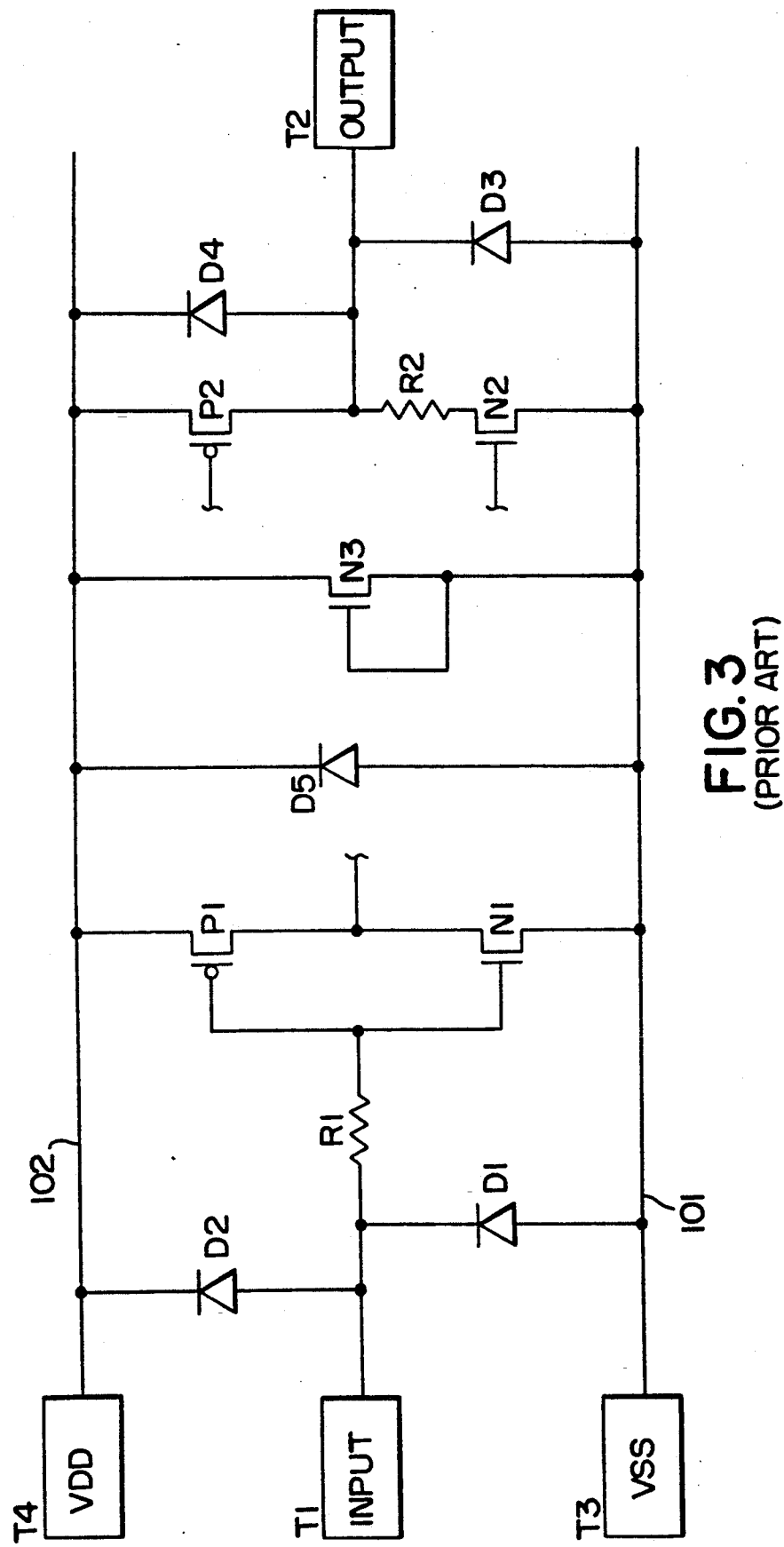
FIG. 3 is a circuit diagram of prior-art generic CMOS input and output protection circuits with the addition of an N-channel transistor between VDD and VSS.
Figure 4:
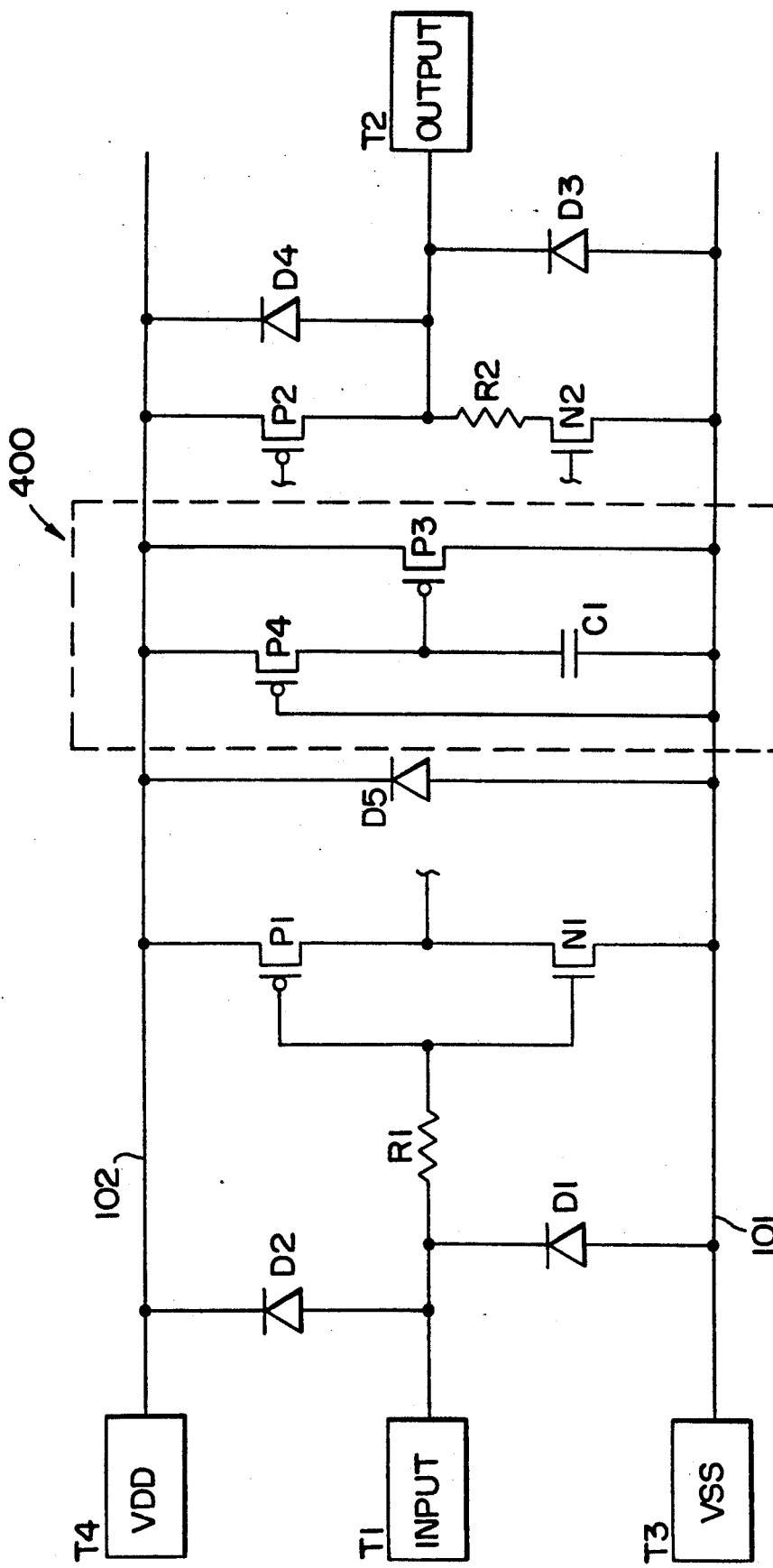
FIG. 4 is a circuit diagram of generic CMOS input and output protection circuits with the addition of the present invention.

Circuit 400 of FIG. 4 includes a P-channel transistor P3, whose source and drain terminals are respectively connected to the VDD and VSS supply rails 102 and 101 and a VDD-tracking delay network that includes a P-channel transistor P4 and a capacitor C1. In the preferred embodiment, capacitor C1 is implemented as an N-channel transistor, though alternatively a P-channel transistor could be used. The VDD-tracking delay network is connected to the gate of transistor P3 and turns transistor P3 on during a transient and off during normal operation of the IC. The gate of transistor P3 is connected to the drain terminal of transistor P4 and to the gate of the N-channel transistor that implements capacitor C1. The source of transistor P4 is connected to VDD supply rail 102 and its gate is connected to VSS supply rail 101. The source and drain of the transistor that implements capacitor C1 are each connected to VSS supply rail 101.

It will be obvious to one skilled in the art that there are numerous circuits that can be employed to perform the VDD-tracking delay function required by the present invention. For example, transistor P4 could be replaced by a resistor.

During normal IC operation, VDD terminal T4 is connected to a positive supply voltage, typically 5 volts, and VSS terminal T4 is typically connected to 0 volts. Under these conditions, transistor P4 is fully on and capacitor C1 is charged to the VDD voltage. Transistor P3 is off, because its gate and source are both at the VDD voltage. Thus there is no conduction path between VDD and VSS, which is essential for normal circuit operation.

Consider the following example of the operation of ESD-protection circuit 400. When power is not applied to the IC, VSS supply rail 101 is considered to be at 0 volts and all internal nodes float at a voltage that is close to 0 volts. When ESD or other phenomena cause a positive (with respect to VSS supply rail 101) transient pulse on output terminal T2, diode D4 becomes forward biased and, since resistor R2 and transistor N2 offer a higher resistance path, diode D4 steers the current through itself and into VDD rail 102. Since VDD rail 102 is floating, its voltage follows by approximately the drop voltage of diode D4, typically 0.7 volts, behind the voltage rise on output terminal T2. When the voltage rise on VDD rail 102 exceeds the P-channel transistor threshold voltage, typically 1 volt, both P3 and P4 start to conduct. The device sizes of P4 and C1, and thus their resistance and capacitance, are chosen such that the rise time of the voltage at the gate of P3 is on the order of microseconds. However, the rise time of the transient pulse on output terminal T2 in response to an ESD through the IC is typically less than 10 nanoseconds, and thus so is the rise time on VDD rail 102. This difference in rise time between the gate terminal (microseconds) and the source terminal (nanoseconds) of transistor P3 results in an increasingly negative gate to source potential. Thus, transistor P3's on conductance (from source to drain) increases in direct proportion to the square of the increasing source to gate potential. The size of P3 is chosen to be large enough so as to be able to handle the transient current without letting the VDD voltage exceed the parasitic breakdown voltage anywhere on the IC. This allows for the transient current to be directed from output terminal T2 to VSS along a desired path and away from any less-robust, undesired, reverse-biased, or parasitic paths.

As a second example applying a transient to a different pair of terminals, if input terminal T1 is held at ground potential or zero volts and a positive pulse is applied at output terminal T2, then the path of least resistance is through the forward-biased diode D4, the on transistor P3, and the forward-biased diode D1. Similarly as a third example, if output terminal T2 is held at ground potential and a positive pulse is applied at input terminal T1, then the path of least resistance is through the forward-biased diode D2, the on transistor P3, and the forward-biased diode D3.

The above examples described how the ESD-induced current follows a desired path when a pulse is applied between certain IC terminals. It will be clear to one skilled in the art that similar desired results are obtained regardless of which IC terminal gets the positive side of the ESD pulse and which terminal the negative side or the ground path, given the combination of diodes D1, D2, D3, D4 and D5 and circuit 400.

Note that with proper engineering of the sizes and the electrical parameters of transistors P3 and P4 and capacitor C1, there is no case where an ESD pulse, up to a certain energy, causes a P-N junction breakdown on the IC—that is, that the transient current will flow through an intended path that contains only forward-biased P-N junctions. A forward-biased P-N junction of a given size can conduct much more current without damage than can a reverse-biased junction of the same size, so the return (in terms of improved ESD protection) on investment (in terms of the precious silicon area that the IC designer allocates to ESD-protection circuit 400) is high.

A further advantage of ESD protection circuit 400 is that it has substantially the same effectiveness over a much wider range of variations in the IC fabrication process than will any ESD-protection technique that includes localized avalanche breakdown of a reverse-biased P-N junction.

FIG. 4 shows a generic realization of the present invention for the case of one input terminal, one output terminal, one VDD supply rail, and one VSS supply rail. It will be obvious to one skilled in the art how the present invention applies to ICs with I/O terminals or with multiple input/output/IO terminals.

It is a further advantage of the present invention that only one instance of ESD protection circuit 400 is required for each pair of VDD and VSS supply rails on the IC. This contrasts with those prior-art approaches, such as Puar '956, that require adding circuitry on each input pin. For multiple VDD or VSS supply rails, an instance of circuit 400 is connected between any given VDD supply rail and any given VSS supply rail. For example, an IC with two VDD supply rails, VDD-1 and VDD-2, and one VSS supply rail, would require two instances of circuit 400—one between VDD-1 and VSS and another between VDD-2 and VSS. The present invention requires an instance of diodes D1 and D2 for each input terminal. Parasitic diodes D3 and D4 serve the same function on output and I/O terminals.

Figure 6:
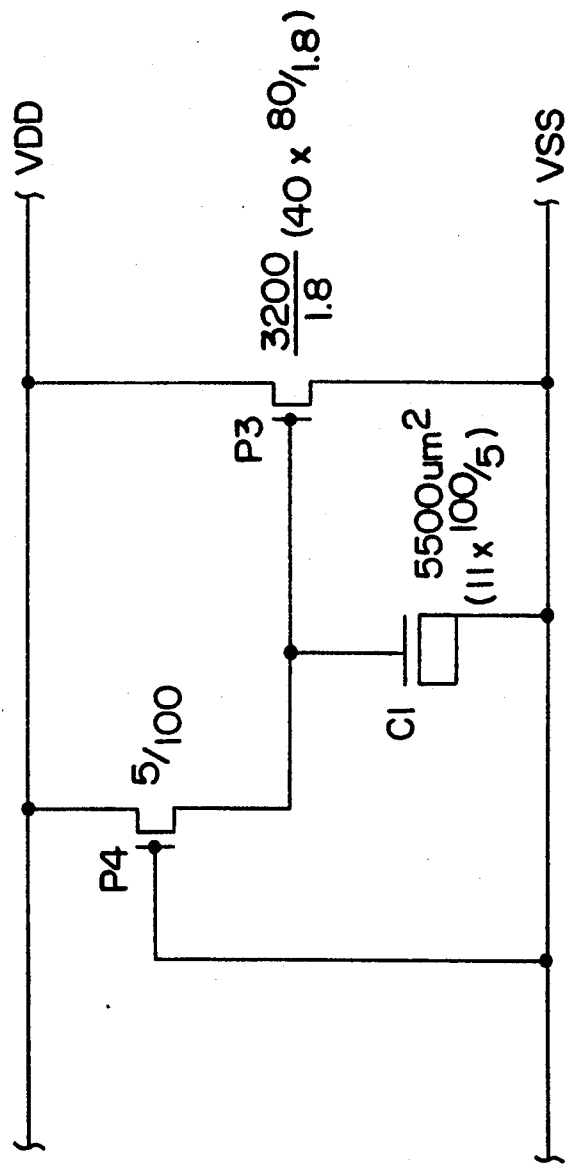
FIG. 6 is a circuit diagram of the present invention showing preferred device sizes for a 1.2 micron CMOS process.

FIG. 6 is a circuit diagram of ESD protection circuit 400 showing preferred device sizes for a CMOS process with 1.2 micron minimum feature sizes and two layers of metal. Transistor P3 is laid out in 40 legs of 8$\mu$ each, which provides an effective width of 3200$\mu$ but with much less series resistance than it would have if laid out as a single leg. The minimum feature size supported by the process is $1.2\mu$, but because of the large width of transistor P3, it is preferably $1.8\mu$ in length so as to be less susceptible to process variations and device flaws. The wider transistor P3 is, the more transient energy the IC can discharge without damage—if it can be laid out wider without impacting the overall die size of the IC then it should be, but $3200\mu$ is believed to be wide enough to provide a commercially acceptable level of ESD protection. Capacitor C1 is preferably implemented as an N-channel transistor of 11 legs each of $100\mu$ width and $5\mu$ length. It is important to the intended function of ESD protection circuit 400 that the series resistance be kept low in the source and drain of transistor P3 and from them to the VDD and VSS supply rails. Similarly, the series resistance should be kept low in the layout of input protection diodes D1 and D2 and from then to input terminal T1 and to the VDD and VSS supply rails. Similarly, the layout of transistors P2 and N2 should be such that the series resistance associated with the parasitic diodes D3 and D4 is kept low. These considerations are well known in the art.

Figure 5:
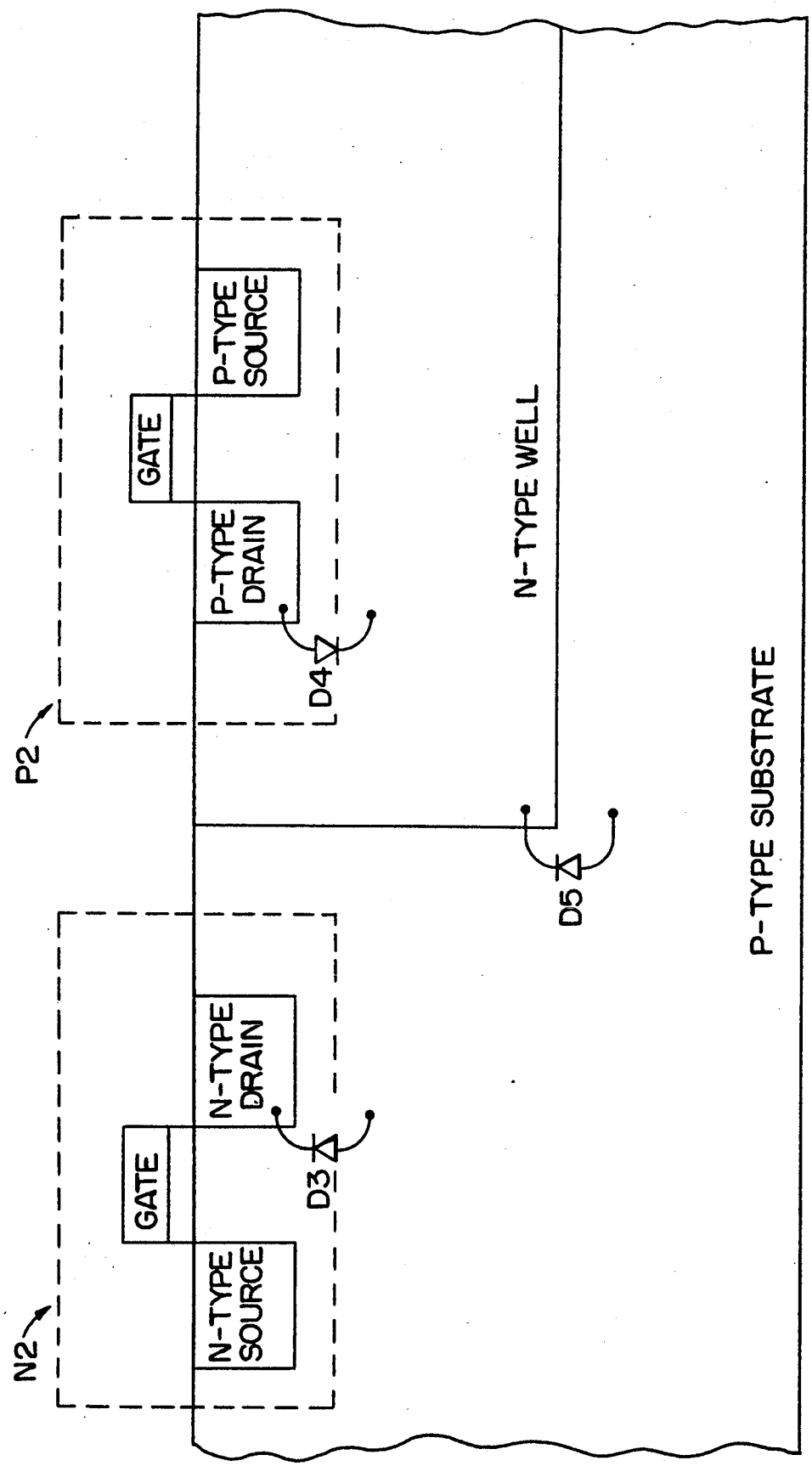
FIG. 5 is a cross section of transistors N2 and P2 showing how diodes D3, D4 and D5 are formed parasitically.

FIG. 5 shows the case of N-type wells in a P-type substrate. The case of P-type wells in an N-type substrate is slightly different. In this case, a diode analogous to D5 is formed between the P-type well and the N-type substrate but the well-to-substrate polarity of this diode is reversed from that of diode D5 as shown in FIG. 5. However, because the P-type substrate is connected to VDD rather that VSS, the polarity of this diode is the same as that of D5 as shown in FIGS. 1-4. ESD protection circuit 400 need not be changed in this case, though the path the ESD energy takes may differ from the case-by-case analysis given above.

The foregoing described the preferred embodiment of the present invention in conjunction with P-substrate CMOS integrated circuits, with the application of the invention to N-substrate CMOS integrated circuits also being described. It is to be noted however, that the invention is also applicable to CMOS-like technologies such as BICMOS integrated circuits. In that regard, the invention is directly applicable to BICMOS integrated circuits having CMOS outputs. In the case of BICMOS integrated circuits having bipolar outputs (by way of example, transistors P2 and N2 of FIG. 4 being PNP and NPN bipolar transistors, respectively), the invention is directly applicable so long as diodes D3 and D4 are present, either as parasitics of transistors N2 and P2 or as specifically added to function as part of the ESD protection circuit. Further of course, the invention is applicable to silicon gate CMOS integrated circuits, as well as any of the foregoing types of CMOS circuits using insulating substrates such as silicon on sapphire so long as the requisite diodes are formed as part of the overall circuit.

In the description to FIG. 4, reference was made to the VDD-tracking delay network that in the preferred embodiment includes P-channel transistor P4 and a capacitor C1. This delay network essentially decouples the gate of transistor P3 from very short duration pulses on the VDD rail 102 as a result of the controlled delay, lag or time constant it imposes on the change in gate-to-drain voltage of transistor P3 in response to pulses in the VDD to VSS voltage. Obviously such delay, lag or time constant may be imposed by other circuits, as desired.

Thus, while the preferred embodiment and various alternate embodiments of the present invention has been disclosed and described herein, it will be obvious to those skilled in the art that various changes in form and detail may be made therein without departing from the spirit and scope of the invention.

I claim:

1. A transient protection circuit for an integrated circuit, at least part of which is a CMOS circuit having a VDD power supply rail and a VSS power supply rail supplying power to said CMOS circuit, comprising:
    a first P-channel MOS transistor having a source coupled to said VDD supply rail, a drain coupled to said VSS supply rail, and a gate;
    a second MOS transistor having a drain coupled to the gate of the first transistor, a source coupled to said VDD supply rail, and a gate coupled to said VSS supply rail; and,
    a capacitor having a first capacitor connection to said gate of said first transistor and a second capacitor connection coupled to said VSS supply rail.

2. A circuit as in claim 1, wherein said second MOS transistor is a P-channel MOS transistor.

3. A circuit as in any one of claims 1 or 2 wherein said capacitor is implemented as a MOS transistor having a gate forming one of said capacitor connections and having a source and drain coupled together forming the other said capacitor connection.

4. A circuit as in claim 3 wherein said capacitor is implemented as a P-channel MOS transistor having a gate forming said second capacitor connection and having a source and drain coupled together forming said first capacitor connection.

5. A circuit as in claim 3 wherein said capacitor is implemented as an N-channel MOS transistor having a gate forming said first capacitor connection and having a source and drain coupled together forming said second capacitor connection.

6. The circuit of claim 1 wherein the threshold of the P-channel transistor is less than the operating voltage of the integrated circuit.

7. A circuit as in claim 3 wherein said capacitor is implemented as an N-channel MOS transistor having a gate forming said second capacitor connection and having a source and drain coupled together forming said first capacitor connection.

8. A transient protection circuit for an integrated circuit, at least part of which is a CMOS circuit having a VDD power supply rail and a VSS power supply rail supplying power to said CMOS circuit, comprising:
    a P-channel MOS transistor having a source coupled to said VDD supply rail, a drain coupled to said VSS supply rail, and a gate, and
    a VDD-tracking delay circuit having an output terminal coupled to the gate terminal of the transistor.

9. A circuit as in claim 8, wherein said VDD-tracking delay circuit comprises an RC network.

10. A circuit as in claim 9, wherein said RC network comprises a resistance coupled between said gate of said P-channel MOS transistor and said VDD supply rail and a capacitance coupled between said gate of said P-channel MOS transistor and said VSS supply rail.

11. A circuit as in claim 10, wherein said resistance comprises a MOS transistor biased on and said capacitance comprises a MOS transistor having a gate forming one capacitor connection and having a source and drain coupled together forming the other capacitor connection.

12. A circuit as in claim 11, wherein said capacitor is implemented as an P-channel MOS transistor.

13. A circuit as in claim 11, wherein said capacitor is implemented as an N-channel MOS transistor.

14. A transient protection circuit for an integrated circuit, at least part of which is a CMOS circuit, and having a VDD and a VSS power supply rail supplying power to said CMOS circuit, comprising:
   a P-channel MOS transistor having a source coupled to said VDD supply rail, a drain coupled to said VSS supply rail, and a gate; and,
   circuit means coupled to said gate of said P-channel MOS transistor for imposing at least a substantial part of a very short term transient VDD to VSS voltage change, caused by an electrostatic discharge, onto said P-channel MOS transistor as a source to gate voltage, thereby turning on said P-channel MOS transistor to limit the DD to VSS voltage change caused by the electrostatic discharge.

15. The transient protection circuit of claim 14 wherein said means for imposing at least a substantial part of a very short term transient VDD to VSS voltage change, caused by an electrostatic discharge, onto said P-channel MOS transistor as a source to gate voltage is also a means for not imposing a substantial part of the VDD to VSS voltage change, caused by power supply voltage changes, onto said P-channel MOS transistor as a source to gate voltage, thereby not turning on said P-channel MOS transistor to limit the VDD to VSS voltage change caused by the power supply voltage changes.

16. The circuit of claim 14 wherein the threshold of the P-channel transistor is less than the operating voltage of the integrated circuit.

17. The circuit of claim 18 wherein the threshold of the P-channel transistor is less than the operating voltage of the integrated circuit.

* * * * *

UNITED STATES PATENT AND TRADEMARK OFFICE
CERTIFICATE OF CORRECTION

PATENT NO.    : 5,287,241

DATED         : February 15, 1994

INVENTOR(S)   : Puar

It is certified that error appears in the above-identified patent and that said Letters Patent is hereby corrected as shown below:

In column 5 line 31 change "T4" to -- T3 --.

Signed and Sealed this

Ninth Day of May, 1995

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,287,241
DATED : February 15, 1994
INVENTOR(S) : Deepraj

It is certified that error appears in the above-identified patent and that said Letters Patent is hereby corrected as shown below:

Column 9,
Line 21, delete "DD" and insert -- VDD --.

Column 10,
Line 18, delete "18" and insert -- 8 --.

Signed and Sealed this

Eighteenth Day of September, 2001

Attest:

Attesting Officer

NICHOLAS P. GODICI
Acting Director of the United States Patent and Trademark Office